United States Patent
Bracker et al.

(10) Patent No.: US 8,791,710 B2
(45) Date of Patent: Jul. 29, 2014

(54) BATTERY SIMULATION SYSTEM HAVING FAULT SIMULATION

(75) Inventors: Joerg Bracker, Delbrueck (DE); Jens Driessen, Paderborn (DE)

(73) Assignee: Dspace Digital Signal Processing and Control Engineering GmbH, Paderborn (DE)

( * ) Notice: Subject to any disclaimer, the term of this patent is extended or adjusted under 35 U.S.C. 154(b) by 445 days.

(21) Appl. No.: 13/293,225

(22) Filed: Nov. 10, 2011

(65) Prior Publication Data

US 2012/0119765 A1     May 17, 2012

(30) Foreign Application Priority Data

Nov. 11, 2010  (DE) .......................... 10 2010 043 761

(51) Int. Cl.
*G01R 31/00* (2006.01)
(52) U.S. Cl.
USPC ........ 324/750.01; 320/118; 320/30; 429/431; 702/64; 324/433
(58) Field of Classification Search
USPC ..................................................... 324/750.01
See application file for complete search history.

(56) References Cited

U.S. PATENT DOCUMENTS

| | | | | |
|---|---|---|---|---|
| 5,848,380 | A * | 12/1998 | Arai et al. ........................ | 702/64 |
| 7,969,756 | B1 * | 6/2011 | Wu .................................. | 363/46 |
| 2004/0228055 | A1 * | 11/2004 | Pearson ........................ | 361/93.1 |
| 2005/0017682 | A1 * | 1/2005 | Canter et al. .................. | 320/118 |
| 2006/0246329 | A1 * | 11/2006 | Gopal et al. ................... | 429/18 |
| 2009/0121908 | A1 * | 5/2009 | Regier ........................... | 341/142 |
| 2012/0074949 | A1 * | 3/2012 | Kepley et al. .................. | 324/426 |
| 2013/0241583 | A1 * | 9/2013 | Chen ....................... | 324/750.01 |

FOREIGN PATENT DOCUMENTS

| | | |
|---|---|---|
| AT | 010763 U2 | 9/2009 |
| AT | 0101763 U2 | 9/2009 |
| CN | 101762800 A * | 6/2010 |
| CN | 101762800 B * | 4/2013 |

OTHER PUBLICATIONS

Chulsung park; Jinfeng Liu; Chou, P.H., "B#: a battery emulator and power profiling instrument," design & test of Computers, IEEE, vol. 22, No. 2, pp. 150, 159 Apr. 2005.
Electric Drive Technology at dSpace, 2010, p. 1-48, published by dSpace.
Catalog 2010, ModelDesk program, p. 315, published by dSpace.
Chulsung park; Jinfeng Liu, Chou, P.H., "B#: a battery emulator and power profiling instrument," design & test of Computers, IEEE, vol. 22, No. 2, pp. 150, 159 Apr. 2005.
Scienlab electronic systems Ltd: Product information Batteriezell Emulator. Jan. 2010 Bochum, 2010. 2 S.
German Search Report in corresponding Application No. DE 10 2011 054 370.8 Aug. 23, 2012.

* cited by examiner

*Primary Examiner* — Benjamin M Baldridge
(74) *Attorney, Agent, or Firm* — Leydig, Voit & Mayer, Ltd.

(57) ABSTRACT

A battery emulation device for simulating a battery cell voltage at a terminal of a battery control unit in accordance with a setpoint value includes a control unit configured to determine the setpoint value and provide the determined setpoint value via a galvanically isolated interface; and at least one emulation channel, each including: a voltage source; an amplifier unit; connection lines for connecting the emulation channel; measurement lines; and a fault simulation device configured to simulate fault states.

16 Claims, 2 Drawing Sheets

BATTERY SIMULATION SYSTEM HAVING FAULT SIMULATION

CROSS-REFERENCE TO RELATED APPLICATIONS

This patent application claims priority to German Patent Application No. 10 2010 043 761.1, filed on Nov. 11, 2010, which is hereby incorporated by reference herein in its entirety.

FIELD

The present invention relates to a device and to a method for simulating fault conditions during testing of battery control units.

BACKGROUND

High-voltage batteries for hybrid or electric-powered vehicles are often composed of series connected single cells. These are manufactured as nickel-metal hydride (Ni-MH), lead or lithium ion (Li-ion) based cells, for example. In the case of Li-ion cells, the nominal voltage is approximately 3.6 V; the final charging voltage is 4.2 V. Voltages of over 600 V are generated by implementing a series connection. Connecting single cells in series can lead to a failed or weakened cell affecting the entire battery stack. To monitor such high-voltage and thus safety-critical batteries, battery control units are used in hybrid and electric-powered vehicles whose purpose is to protect the individual cells from overcharging, overdischarging and thermal overloading, and to prolong the lifetime thereof. To this end, efforts are continually directed towards adapting all cells to the same charge condition. In addition, the battery control unit must estimate the remaining battery capacity from the available parameters and make the calculated value available to the higher-level hybrid control unit. The communication is normally carried out via the vehicle CAN (controller-area network) bus.

The structure of a battery control unit is organized into the actual battery management system (BMS) and the cell modules (CM). They are interconnected via an isolated CAN bus. In each case, a CM is assigned to a cell stack, which is a subset of all single cells of the battery and is responsible both for measuring the cell voltages, as well as for selectively discharging individual cells. For this purpose, the CM has a switch (transistor) for each cell that, in the ON state, connects the cell to a load via a resistor.

By activating the associated switch, the control unit always loads those cells which have a higher voltage level than the remaining cells. This mechanism of cell charge compensation has the effect of keeping all cells of the battery at the same charge level. Differences in cell behavior are thus evened out.

Generally, to ensure proper control unit functioning, different types of tests are performed at different development stages. If hardware and software are already available for a control unit, what are known as hardware-in-the-loop (HIL) tests are normally carried out, in which the presence of a controlled system, as well as possibly of other external components or other control units, is simulated for the control unit to be tested. In the case of a motor controller, the controlled system is the motor, for example, or in the present instance of a battery control unit, it is the battery. External components can be other control units, for example, to which the control unit to be tested is connected via a bus and with which it communicates via messages. Such control units are often simulated by what is generally referred to as a restbus simulation, in which only those messages to be expected from the control unit to be tested are simulated on a bus.

Generally, the HIL simulation can take place at different levels:

At the signal level, only the digital signals are computed in a simulation model on a suitable processing unit, for example a real-time processor, and transmitted to the processing unit of the control unit. This requires access to a suitable signal interface. Often, this necessitates opening the control unit to be tested, particularly when testing control units for electric motors. Such tests are relatively simple to carry out, as soon as the signal interface is exposed. However, they cannot be used to verify the reliability performance of the power electronics. Real currents and/or voltages, which are generated in accordance with a simulation model, are transmitted at what is generally known as the "power level" directly via the power electronics of the control unit to the same. This is also referred to as emulation when generating these voltages and currents.

At this test level, not only is the control algorithm of the control unit tested, but also the power electronics thereof. Since the controlled system is only simulated, it is readily interchangeable, and the tests can be flexibly adapted to different situations.

When simulation is performed at the mechanical level, the complete unit, composed of the control unit and the physically present controlled system, can be tested on a mechanical test bench using an electric motor or a throttle valve, for example. These tests are very expensive, rather inflexible and, to some extent, also safety critical. However, they permit testing of load conditions in real-world operation.

Fault simulations used for testing the reaction of the control unit to fault situations make up another important component of HIL tests. To simulate cable ruptures or similar faults, additional plug-in cards for HIL systems, generally referred to as failure insertion units (FIUs), are normally available. They encompass circuits having switches that are controllable remotely and by automation to simulate cable ruptures, short circuits and/or mistakenly interchanged terminals for all control unit connections. There are FIU cards both for sensors, as well as for actuators; they being additionally combined with load cards, in the case of actuators.

Only tests for battery control units are discussed in the following. In this context, merely the control strategy of the BMS is to be examined; thus, it suffices to test only the BMS. In this case, the CM are simulated at the signal level. However, to test the entire battery control unit at the power level, all or at least one CM must be integrated in the HIL system. As a controlled system, it is necessary to include both a real-time battery simulation model, as well as a cell voltage emulator for outputting the analog terminal voltage. Battery simulation models and cell voltage emulators are commercially available. Examples of commercially available battery simulation models may be found, for example, in "Electric Drive Technology at dSPACE," a brochure published by dSpace and available on the Internet at dspace.de/shared/data/bkm/ElectricalDrive_en/blaetterkatalog/.

These battery simulation models for testing battery control units simulate the battery behavior as an interconnection of a plurality of single cells. In this context, the cell model reproduces the cell voltage and the charge state of a battery cell. The typical cell behavior of different cell technologies, such as Li-ions, Ni-MH or lead, can be taken into consideration. This includes differences in charging and discharging, as well as the dynamic performance in response to loading step changes, and residual currents caused by gassing effects, for example. Normally, the battery simulation model also provides one or a plurality of temperature values that are simulated for the control unit, for example also via the hardware unit of the cell voltage emulators. The battery model is then composed of individual cell models. In this context, it supports the series connection of cells to reach the required voltage level, as well as a parallel connection and the currents resulting therefrom. Individual cell parameters and states, such as internal resistance or initial charge state, remain individually settable in the process, and the resulting cell voltages can also be made available to the battery control unit on an individual basis. The currents adjusted by the battery control unit for the cell charge compensation are then likewise considered. In the process, parameterization may be handled by graphical user interfaces. An example of such a graphical user interface is the ModelDesk program referenced at page 315 of "Catalog 2010" published by dSPACE, available at dspace.de/shared/data/bkm/catalog2010/blaetterkatalog/.

Cell voltage emulators are normally composed of individual, controllable voltage sources, whose setpoint voltage values are determined by the battery model. A cell voltage emulator is often modularly constructed by interconnecting a plurality of emulation units which each include a group of cell emulation channels having a separate, controllable voltage source. To supply power to an emulation unit, a power supply unit is used, whose voltage is distributed by DC/DC converters to emulate an individual battery cell per cell emulation channel. The channels are galvanically isolated from one another and are connectable in series, as well as in parallel. Presently, total voltages of nearly 1000 V are reached in the case of a series connection. Higher currents can be produced in the case of the parallel connection. Besides the voltage supply of a few volts, a single emulation channel includes an amplifier unit for controlling the cell voltage in accordance with the predefined setpoint value. A relatively broad voltage range for a single emulation channel permits emulation of defective cells. For example, a short-circuited cell can be emulated by outputting 0 V. On the other hand, a voltage greater than the nominal voltage emulates an increased internal resistance of the cell during the charging process. In order to realistically emulate a battery, it is necessary to rapidly correct setpoint value step changes. Currently requirements stipulate that this take place in less than 500 μs.

The requisite, fast closed-loop control of the voltage sources is mostly performed by a control unit, i.e., a fast processing unit. For this purpose, an FPGA (field-programmable gate array) may be provided, for example, which is able to control the channels of a plurality of emulation units. The setpoint voltage values are transmitted (digitally) to the amplifier units of the individual emulation channels via a bus connection having a galvanically isolated interface to the channels, for example through optocouplers. The control unit exchanges data with a higher-order processing unit on which the battery simulation model is executed in accordance with which the setpoint voltage values are determined for the battery emulation. As in the case of a battery in real-world operation, the emulated cell voltages are also connected in series in the emulation process.

The voltage is measured in the control unit, i.e., in the CM, with a high degree of precision since the battery cells often have a very flat discharge curve. For this reason, a high degree of precision is required when emulating the cell voltages. Deviations higher than 2 mV are frequently not tolerable. The cell charging compensation function loads the emulated voltage source with several hundred mA. The accuracy of the voltage must be retained during loading; it is, therefore, necessary to compensate for a voltage drop on the lines from the emulation to the control unit. For this purpose, each cell emulation channel is provided with a measurement line which picks off the exact voltage value at the input of the CM for the amplifier unit. Moreover, in each cell emulation channel, the compensation current is recorded, transferred to the control unit, and taken into consideration in order to correctly simulate the charge state. Another measurement line is used to examine whether the voltage value of the reference potential, which, in the case of the series connection of the cells and channels is defined by the potential of the voltage source connected in incoming circuit, also conforms with the voltage value that the control unit records for the voltage source connected in incoming circuit.

However, a disadvantage of the afore-mentioned battery simulation systems is that they are not capable of simulating faults, such as cable ruptures, etc., since the high voltages and the additional measurement line required in battery emulation systems preclude the use of the failure simulation cards (FIU cards) normally used in HIL simulations.

SUMMARY

In an embodiment, the present invention provides a battery emulation device for simulating a battery cell voltage at a terminal of a battery control unit in accordance with a setpoint value, the battery emulation device including: a control unit configured to determine the setpoint value and provide the determined setpoint value via a galvanically isolated interface; and at least one emulation channel, each including: a voltage source; an amplifier unit; connection lines for connecting the emulation channel; measurement lines; and a fault simulation device configured to simulate fault states.

In another embodiment, the present invention provides a method for testing a battery control unit using a battery emulation device having a control unit and at least one emulation channel for emulating a battery cell voltage at a terminal of the control unit, the method including: providing a connection from the at least one emulation channel to a reference potential, to a terminal of the battery control unit, and to at least one other emulation channel; recording the reference potential at another terminal of the control unit and recording an output voltage of the emulation channel at the terminal of the battery control unit; transferring measured voltages to an amplifier unit; and simulating a fault state by controlling at least one switch provided in the at least one emulation channel.

DETAILED DESCRIPTION

Figure 1:
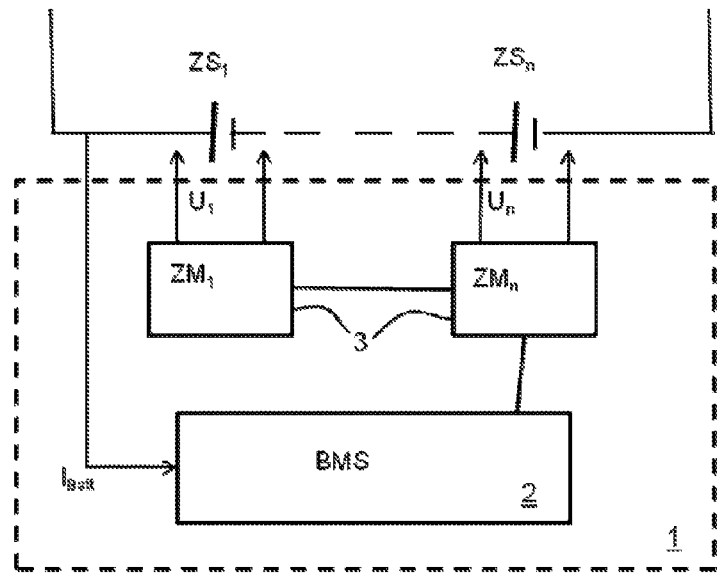
FIG. 1 depicts a schematic representation of a battery control unit connected to a battery.

In an embodiment of the present invention, a battery emulation device having a control unit and at least one emulation channel is provided for simulating a battery cell voltage at a terminal of a battery control unit in accordance with a setpoint value predefined by the control unit and provided via a galvanically isolated interface. The emulation channel has a voltage source having an amplifier unit for controlling the output voltage, connection lines for connecting the emulation channel, in particular to a reference potential, to a terminal of the battery control unit, and, to an emulation channel connected in outgoing circuit, and the emulation channel further has measurement lines. The measurement lines are provided to record the reference potential of another terminal of the control unit and the output voltage of the emulation channel at the terminal of the control unit, the measurement lines being used for transferring the measured values to the amplifier unit which uses them to control the output voltage in closed loop in accordance with the determined setpoint value. In an embodiment, the emulation channel has means for simulating fault states, in particular cable ruptures.

In an embodiment, provided are a first connection line having an input terminal for connecting the controllable voltage source to a reference potential, in particular to an output terminal of an emulation channel connected in incoming circuit, a second connection line having a pick-off terminal for connecting the output voltage of the controllable voltage source to a corresponding terminal of a battery control unit, and a third connection line having an output terminal for connecting the output voltage of the controllable voltage source to a load, in particular to an input terminal of an emulation channel connected in outgoing circuit.

A first measurement line for recording the value of the reference potential, as is present at a first terminal of the control unit, and a second measurement line for recording the value of the output voltage, as is present at a second terminal of the control unit, may further be provided.

In this embodiment, any suitable circuit elements—such as relays, MOSFETs, IGBTs, bipolar transistors or also high-voltage resistant switches—hereinafter also denoted as "switches," are to be initially understood as means for simulating fault states.

In an embodiment, provided in the first and in the second connection line of the emulation channel of the battery emulation device according to the present invention, are switches for simulating fault states, in particular a first switch for simulating a cable rupture of the cell connector between two battery cells, as well as a second switch for simulating a cable rupture in the connection between the control unit and the battery cell, the switch being controllable by the control unit via the galvanically isolated interface.

In accordance with another advantageous use of the second switch, the control unit may be safely isolated from the battery emulation device for the initial operation.

In an embodiment, the first connection line and the first and second measurement lines may be connected to the amplifier unit inputs, and the second and the third connection lines may be connected to the amplifier unit output.

In this embodiment, "measurement line" connotes high-resistance lines or highly resistively coupled lines that are used solely for performing a measurement, preferably a voltage measurement, and no significant current flows through these "measurement lines." In contrast, "connection line" connotes a current-conducting connection.

To prevent overdriving the amplifier in the case of an open connection line and to suppress potential interference signals from entering the emulation channel amplifier via the measurement lines, a preferred embodiment provides that controllable switches may also be installed in the measurement lines. A third switch may be provided that, in a first switching state, closes the first measurement line, and, in a second switching state, connects the input of the first measurement line leading into the amplifier unit with the input of the first connection line leading into the amplifier unit, so that the value incoming via the first measurement line is the same as the value recorded as a reference potential from the amplifier unit. A fourth switch may further be provided that, in a first switching state, closes the second measurement line, and, in a second switching state, connects the input of the second measurement line leading into the amplifier unit with the output of the amplifier unit, so that the value incoming via the second measurement line is the same as the value of the output voltage from the amplifier unit.

It is, therefore, provided that, in a method for simulating faults using the battery emulation device in accordance with an embodiment of the present invention, when a switch is opened in a connection line to simulate a cable rupture, the switch in the corresponding measurement line is switched over from a first switching state to a second switching state at the same time, so that the measured value is picked off by the measurement line not at the terminal of the control unit, but rather at the corresponding connection line upstream of the simulated cable rupture. Thus, the input of the first measurement line leading into the amplifier unit is connected with the input of the first connection line leading into the amplifier unit, and the input of the second measurement line leading into the amplifier unit is connected with the output of the second connection line leading out from the amplifier unit. This means that the third switch in the first measurement line is switched at the same time as the first switch for simulating a cable rupture of the cell connector, and/or the fourth switch in this second measurement line is switched at the same time as the second switch for simulating a cable rupture in the connection between the control unit and the battery cell.

The switches may be configured as relays. In addition, the relay switches between the battery emulation device and the control unit advantageously provide a reliable cut-off mechanism for the separation from the control unit and simulation device. It is advantageous when, in parallel to the switch setting of the second circuit state of the third and the fourth switch, a capacitor or a resistor or a combination of resistor and capacitor are still connected in each case, in order to attenuate overshooting during switch-over processes. Connecting a resistor in an incoming circuit prevents an overdriving in the case of a switched-off measurement line.

The galvanically isolated data communication between the emulation channel and the control unit may be realized, for example, by optocouplers and a flat band cable connection connected thereto. The data link is preferably a bus connection; and the control unit is implemented in an FPGA.

The control unit communicates, in turn, with a higher-level processing unit on which a battery simulation model is executable. The higher-level processing unit encompasses, for example, a processor, a plurality of processors, or a processor and an FPGA. The control unit receives the setpoint values for the cell voltages from the battery simulation model that is executed on the processing unit.

A plurality of emulation channels may be combined on one plug-in card for an emulation unit.

The voltage supply for the emulation unit is provided in an embodiment via a line voltage, with DC/DC converters being used for supplying the emulation channels. 24 V of the power supply unit may be converted into voltages of between +10 V and −10 V. The line voltage is constant. The output voltage from the amplifier unit for emulating the cell voltage is adjusted by the control unit in accordance with set values from the battery simulation model.

An emulation channel may include a current measuring unit preferably integrated in the amplifier unit for recording the compensation current controlled by the control unit. The values ascertained by the current measurement are communicated via the galvanically isolated data connection to the control unit, from where these measured values are transmitted to the higher-level processing unit having the battery simulation model.

The fault simulation switch is likewise controlled in an embodiment by the control unit via the galvanically isolated data bus connection of the emulation channel in accordance with values set in the battery simulation model or by a user via a user interface for setting test sequences and for parameterization (which may be a graphical user interface).

In one embodiment, an emulation unit is implemented on a plug-in card and encompasses a plurality of emulation channels, preferably four. The individual emulation channels may be galvanically isolated from one another. The galvanic isolation between the individual emulation channels within one emulation unit does not need to be rated as high as the isolation between emulation unit and the surroundings, i.e., between the emulation unit and the surroundings in a broader sense. In the first mentioned case, an isolation of preferably more than 10 V suffices; in the latter case, the isolation is preferably rated for voltages of up to 1 kV.

An embodiment of the present invention provides that the emulation channels be connectable both in series, as well as in parallel, in order to increase the output current from an emulation unit, i.e., to emulate a higher cell current. For example, one single channel may also be used to simulate a temperature sensor.

The control unit may be implemented on a separate plug-in card and encompasses the control processing unit, for example, an FPGA, and a data-bus driver for exchanging data with the emulation units and emulation channels via a bus connection. This may be implemented by ribbon cables. This makes it readily possible to connect the control unit to several emulation units. Via this bus connection, both the data and commands for battery cell emulation, as well as for fault simulation are transmitted. Since the interface for the data bus is galvanically isolated at each emulation channel, a galvanically isolated control of the switches is ensured for fault simulation.

The appropriate terminals are preferably placed on an emulation unit plug-in card in a way that makes them readily accessible when the plug-in card is inserted into a module carrier. The terminals may preferably be provided at a readily accessible end of a plug-in card, for example, at the end of the plug-in card that is not directly fastened to the housing of the module carrier. The appropriate terminals include, for example, a shielded Sub-D connector for connecting the battery emulation to the control unit and a terminal for supplying power (preferably 24 V). This configuration provides ease of operation for manipulating the terminals when the plug-in cards are inserted into a 19"/3HU module carrier, for example.

The battery emulation device according to embodiments of the present invention shall be explained in further detail hereinafter with reference to the drawings. Functionally similar or identical circuit elements are referred to using the same reference numerals.

FIG. 1 shows an exemplary simplified circuit diagram of a battery control unit 1 connected to a battery in an electric vehicle. Battery control unit 1 is composed of a BMS control unit 2 and a plurality of CM control units 3, the CM control units 3 and the BMS being interconnected via an isolated CAN bus. A CM is assigned in each case to a cell stack, i.e., to a subset of all single cells of the battery (not shown in FIG. 1). The CM control units 3 monitor, inter alia, the voltages of the individual batteries cells and of the battery cell stack.

Figure 2:
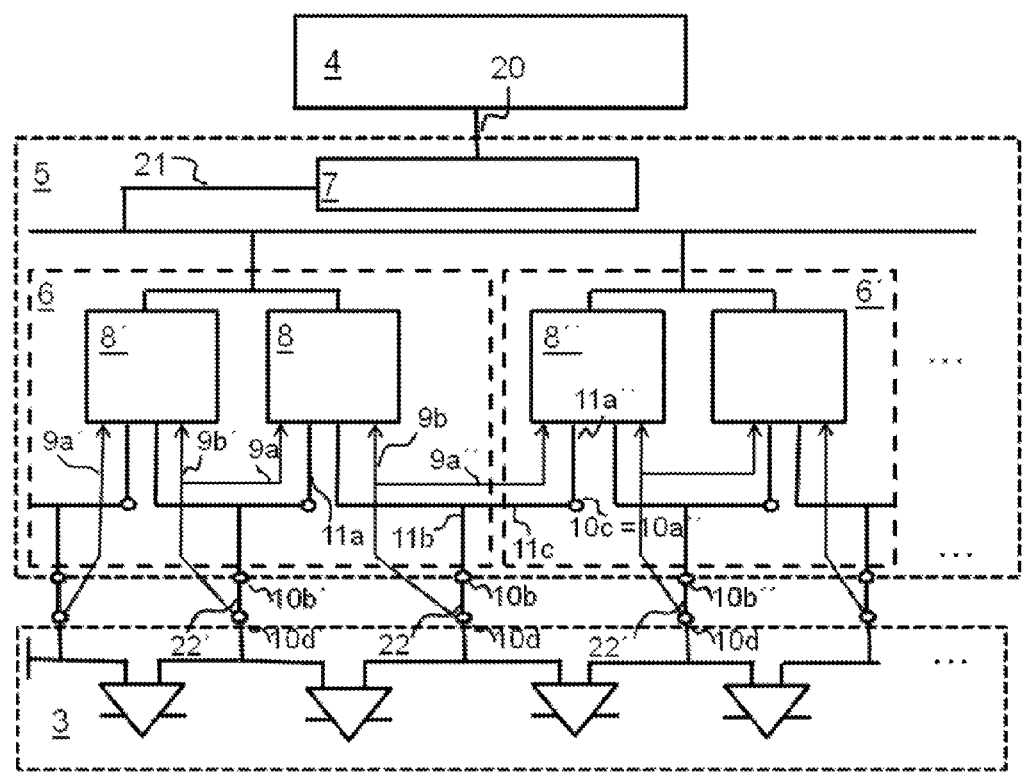
FIG. 2 depicts a schematic representation of a battery emulation device connected to a cell module of a battery control unit.

FIG. 2 shows a schematic representation of a battery emulation device 5, which is connected to a higher-order processing unit 4, through which a battery simulation model (not shown) is executable, and to a cell module (CM) 3 of a battery control unit 1.

Battery emulation device 5 includes a control unit 7, a plurality of emulation units 6, 6' having emulation channels 8, 8', 8", which feature connection lines 11$a$, 11$b$, 11$c$, 11$a$" and measurement lines 9$a$, 9$a$', 9$b$, 9$b$'. The emulation channels are connected to inputs 10$d$, 10$d$' of battery control unit 1, or rather of a CM 3 of a battery control unit 1.

In the battery simulation model, the cell voltage and the charge state of a battery cell are computed for each cell. It will be appreciated that the typical cell behavior of different cell technologies, such as Li-ions, Ni-MH or lead may be taken into account during the computation. The computation may be performed for identically constructed cells, such that only one reference cell and the differential voltages of the other cells are considered in relation to this reference cell. The calculated cell voltages are transmitted as setpoint values to control unit 7, either via copper or optical cables 20. A digital data interface may be used—e.g., an LVDS interface. This type of connection between processing unit 4 and control unit 7 ensures a galvanically isolated data transmission for protecting the simulation computer.

Control unit 7 communicates, in turn, with emulation units 6, 6', preferably via a data-bus connection 21. It includes a control logic unit, for example an FPGA, and a data-bus driver for data-bus connection 21. On the basis of the predefined setpoint values, control unit 7 controls emulation channels 8, 8', 8", which emulate the cell voltages, but also transfers simulation-related data to processing unit 4, for example current values, that are recorded in emulation units 6, 6', or simulated temperature values.

Figure 3:
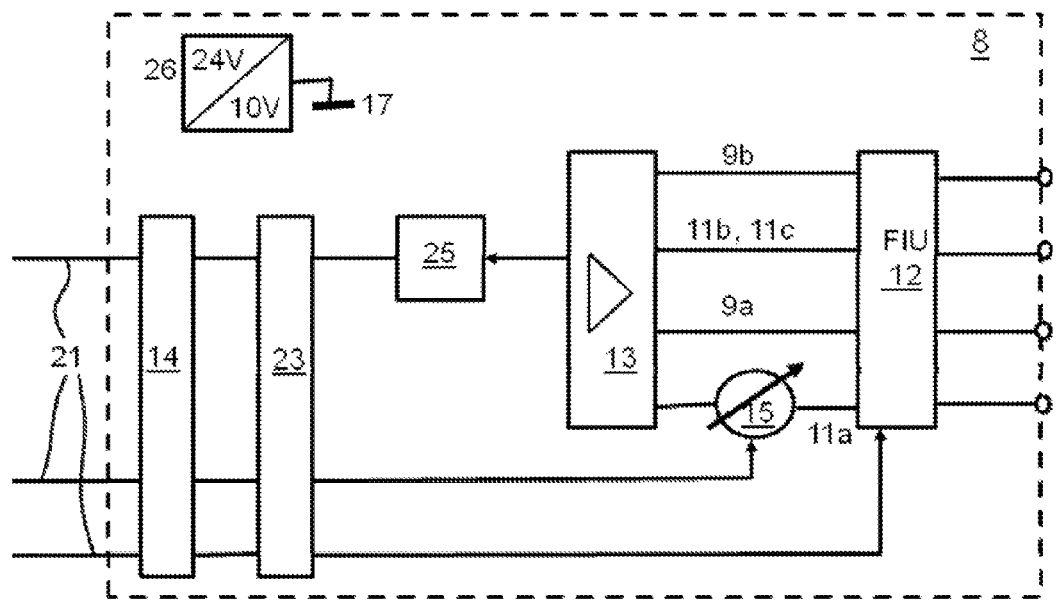
FIG. 3 depicts a schematic representation of an emulation channel.
Figure 4:
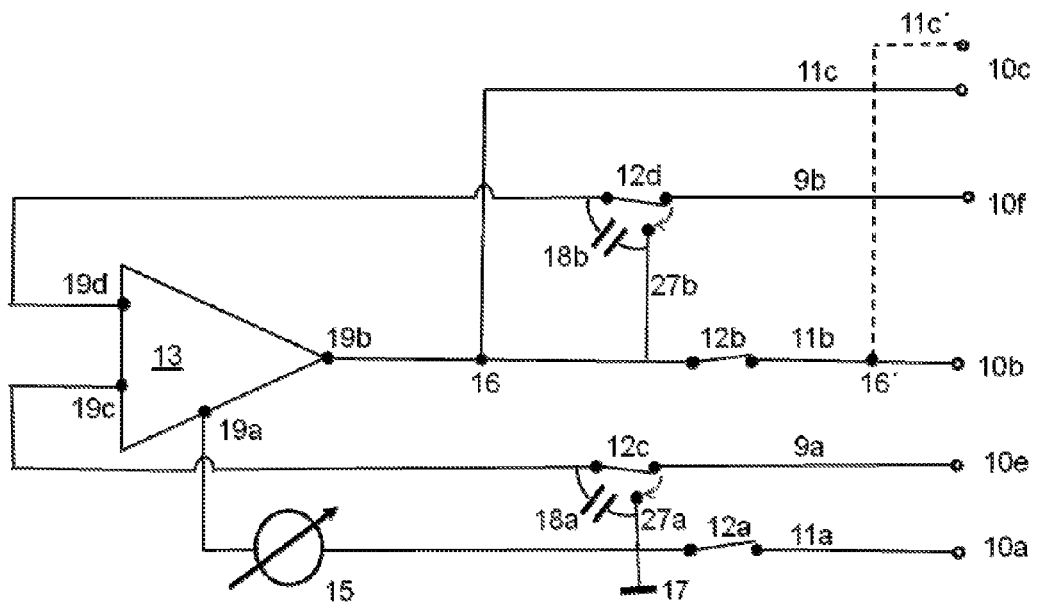
FIG. 4 depicts a schematic representation of an emulation channel having an emulation circuit.

Emulation channels 8, 8', 8" each include a controllable voltage source 15 and an amplifier unit 13 (shown in FIGS. 3 and 4). Emulation channels 8, 8', 8" simulate the cell voltages of individual battery cells for their associated CM 3. They are galvanically isolated from one another, but may be connected in series as in the case of cells of a real-world battery. They may also be connected in parallel in the case that a higher current flow is required, so that a plurality of emulation channels 8, 8', 8" emulate a voltage cell or simulate another current. FIG. 2 shows the series connection of emulation channels 8, 8', 8" for testing CM 3 and the entire battery control unit 1. The interconnection is provided by connection lines 11.

A first connection line 11$a$ having an input terminal 10$a$ for connecting emulation channel 8 to a reference potential, in particular to the output voltage of an emulation channel 8' connected in incoming circuit, is provided at an emulation channel 8. Also provided are a second connection line 11$b$ having a pick-off terminal 10$b$ for connecting the output voltage of emulation channel 8 to terminal 10$d$ of battery control unit 3, and a third connection line 11$c$ having an output terminal 10$c$ for connecting the output voltage from emulation channel 8, in particular to an input terminal 10$a$" of an emulation channel 8" connected in outgoing circuit. If emulation channel 8 were the last emulation channel of a battery simulation, then terminal 10$c$ would not be needed, i.e., connection line 11$c$ would remain open.

Those skilled in the art will further appreciate that connection lines 11$b$ and 11$c$ may be constituted in part of the same connection line, and connection line 11$b$ may branch off at any given point from connection line 11$c$ between the emulation channels, and vice versa. It will further be appreciated with respect to FIG. 2 that, for reasons of symmetry, terminal 10a may be designated as terminal 10c' from the perspective of emulation channel 8', and terminal 10c may be designated as terminal 10a" from the perspective of emulation channel 8".

In practice, these terminals may be any conceivable type of terminal, thus, there may also be a plurality of terminals. For example, both a terminal 10c, as well as a terminal 10a"; or a terminal may be realized by a galvanically isolated switch in a connection line, so that, for example, connection lines 11c and 11a" may be connected or disconnected by a switch of this kind.

The connection between terminals 10b and 10d may be provided by cables 22 of considerable length. Since, in the testing of the battery control unit, it is advantageous to know precisely which voltage value is present at terminals 10d, 10d' of control unit 3, each emulation channel 8, 8', 8" still features two measurement lines 9a, 9a', 9a", 9b, 9b', 9b". For example, a first measurement line 9a of emulation channel 8 is used for recording the value of the reference potential, in particular the output voltage from emulation channel 8', as is present at a terminal 10d' of control unit 3. A second measurement line 9b records the output voltage of emulation channel 8 that is present at terminal 10d' of control unit 3. Measurement line 9a is also able to pick up the value of the reference potential, as is present at terminal 10d' for control unit 3, at a corresponding measurement line 9b' of emulation channel 8".

FIG. 3 shows schematically the configuration of an emulation channel 8 in an embodiment. It includes a voltage source 26 having a reference ground 17 for supplying power to emulation channel 8, a controllable voltage source 15, and an amplifier unit 13. Controllable voltage source 15 includes a reference voltage source and a digital-to-analog converter that is driven via a bus-connection interface 14 to control unit 7. To protect against high voltages, an isolation barrier 23 is configured upstream of bus-connection interface 14. Controllable voltage source 15 is connected to an amplifier unit 13, i.e., a power amplifier. To transmit information from emulation channel 8 to control unit 7, also provided in emulation channel 8 is an analog-digital-converter 25 that likewise transmits the measured current values as galvanically isolated values to control unit 7, from where they are communicated to the simulation model on processing unit 4. Control unit 7 is able to communicate via data-bus connection 21 with a multiplicity of emulation channels.

Amplifier unit features connection lines 11a, 11b, 11c and measurement lines 9a, 9b. It is likewise controlled by the control unit and is thus set to regulate the voltage output to line 11b and 11c in such a way that a voltage difference is set between measurement lines 9a, 9b in accordance with the setpoint voltage values.

Branch point in lines 11b and 11c is not yet shown in FIG. 3. Likewise schematically shown in combination are switches 12 for fault simulation. These switches are likewise controlled by control unit 7, i.e., via bus-connection interface 14 and isolation barrier 23. Thus, a galvanically isolated control of fault simulation switches 12 is ensured.

FIG. 4 shows the fault simulation circuit in an embodiment in greater detail. It depicts amplifier unit 13, whose input 19a is connected via a connection line 11a to voltage source 15 which is referenced to reference ground 17 of emulation channel 8. Leading out from output 19b of amplifier unit 13, where the output voltage of emulation channel 8 is output, is a connection line, from whose nodal point 16 connection line 11b leads to pick-off terminal 10b, and connection line 11c leads to a terminal 10c, to which, for example, another emulation channel 8" may be connected. In addition, a measurement line 9a leads to an input 19c of the amplifier unit 13, and a measurement line 9b to an input 19d of the amplifier unit 13. Terminals 10e and 10f are connected to inputs 10d' and 10d of CM 3, in order to pick up the measured voltage values there and transmit them to amplifier unit 13 that regulates the voltage at output 19b of amplifier unit 13 in such a way that the measured voltage differential values correspond, as actual voltage, to the setpoint voltage from the battery simulation model.

Lines 11a and 11b include controllable switches 12a and 12b which may be used to simulate a cable rupture in the cell connector by opening switch 12a, or in the connection between the control unit and battery by opening switch 12b, or to simulate both types of cable rupture.

Switch 12a is provided between reference ground 17 and terminal 10a. Switch 12b is provided between output 19b of the amplifier unit and terminal 10b. It may be located upstream or downstream of nodal point 16. The latter variant is indicated by nodal point 16' and connection line 11c'. In this case, by opening switch 12b, not only is a cable rupture simulated in connection line 11b to the control unit, but also in connection 11c' to an emulation channel connected in outgoing circuit. If connection line 11c branches off upstream of nodal point 16, the benefit is thereby derived that the cable ruptures referred to may be simulated separately. Given an identical emulation channel 8" connected in outgoing circuit, the cable rupture in the cell connector to a next battery cell may be simulated by opening a switch 12a" provided there, analogously to switch 12a. In the practical implementation, it may likewise be provided for nodal point 16 to be located downstream of terminal 10b, so that an emulation channel 8 only has four terminals.

To prevent a current flow between a CM and the battery emulation device via measurement lines 9a or 9b in the case that switch 12a or 12b is open, the corresponding measurement lines 9a or 9b should be interrupted during the fault simulation of the cable ruptures. For that reason, controllable switches are likewise provided in measurement lines 9a, 9b. Namely, a third switch 12c in measurement line 9a and a fourth switch 12d in measurement line 9b. These switches, 12c and 12d, must each be actuated simultaneously with the respective corresponding switch, 12a or 12b, in the connection line.

However, if measurement lines 9a, 9b were merely interrupted, then no voltage would be present at inputs 19c, 19d, which would lead to clipping of the operational amplifier in amplifier unit 13, thereby causing unrealistic overshooting when switching back. To rectify this problem, switches 12c, 12d are configured in measurement lines 9a, 9b in such a way that, upon interruption of a measurement line 9a, 9b between control unit 3 and battery emulation device 5, the section of measurement line 9a, 9b that is connected to amplifier unit 13 is likewise connected to corresponding connection line 11a, 11b, whereby input 19a of amplifier unit 13 and output 19b of amplifier unit 13 are connected to measurement input 19c of amplifier unit 13 and to measurement input 19d of amplifier unit 13, respectively.

In concrete terms, this means that measurement line 9a is closed in a first switch setting of third switch 12c. By switching over into a second switch setting, first measurement line 9a is interrupted, and a connection 27a to first connection line 11a is closed, so that, to measure the reference potential at input 19c, the reference potential is now picked off directly at controllable voltage source 15.

Analogously, in a first switch setting of fourth switch 12d, measurement line 9b is closed and is interrupted by switch 12d switching over to a second switch setting; at the same time, a connection 27b to second connection line 11b being closed, so that a value corresponding to the output voltage from amplifier unit 13 is now present as a measured value at input 19d.

To attenuate overshooting during the switch-over process, capacitors 18a, 18b for switches 12c and 12d are provided in parallel to connection lines 9a, 9b and corresponding connections 27a, 27b.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A battery emulation device for simulating a battery cell voltage at a terminal of a battery control unit in accordance with a setpoint value, the battery emulation device comprising:
   a control unit programmed to determine the setpoint value and provide the determined setpoint value via a galvanically isolated interface; and
   at least one emulation channel, each including:
   a voltage source;
   an amplifier unit;
   connection lines for connecting the emulation channel, wherein a first connection line is configured to connect the emulation channel to a reference potential, and a second connection line is configured to connect the emulation channel to the terminal of the battery control unit;
   measurement lines configured for connecting to the amplifier unit; and
   a fault simulation device configured to simulate fault states of a battery.

2. The battery emulation device according to claim 1, wherein the fault states are cable ruptures.

3. The battery emulation device according to claim 1, wherein the connection lines comprise:
   a third connection line configured to connect the emulation channel to another emulation channel connected in outgoing circuit,
   wherein the first connection line is connected to an input of the amplifier unit, and the second and the third connection lines are connected to an output of the amplifier unit.

4. The battery emulation device according to claim 3, wherein the simulation device comprises at least one of:
   a first switch in the first connection line and configured to simulate a cable rupture of the cell connector between two battery cells, and
   a second switch in the second connection line and configured to simulate a cable rupture in the connection between the control unit and the battery cell.

5. The battery emulation device according to claim 4, wherein the measurement lines comprise:
   a first measurement line for recording the reference potential at another terminal of the battery control unit; and
   a second measurement line for recording the output voltage of the emulation channel at the terminal of the battery control unit,
   wherein the measurement lines are connected to the inputs of the amplifier unit to transfer the measured values to the amplifier unit.

6. The battery emulation device according to claim 5, wherein the simulation device comprises at least one of:
   a third switch in the first measurement line; and
   a fourth switch in the second measurement line.

7. The battery emulation device according to claim 6, wherein the first, second, third and fourth switches are relays.

8. The battery emulation device according to claim 6, wherein the control unit and the at least one emulation channel are configured to communicate via a data-bus connection.

9. The battery emulation device according to claim 8, wherein the first, second, third and fourth switches are controllable by the control unit via the data bus connection and the galvanically isolated interface.

10. The battery emulation device according to claim 1, wherein the voltage source is a controllable voltage source having a reference voltage source and a digital-to-analog converter.

11. The battery emulation device according to claim 1, wherein a plurality of emulation channels are grouped in an emulation unit and wherein the emulation unit is implemented on a plug-in card.

12. The battery emulation device according to claim 11, wherein the control unit is implemented on a separate plug-in card that is connectable via ribbon cables to a plurality of other plug-in cards.

13. The battery emulation device according to claim 11, wherein terminals of the emulation unit are provided at a readily accessible end of the plug-in card.

14. The battery emulation device according to claim 13, wherein the readily accessible end of the plug-in card is an end of the plug-in card that is not directly fastened to a housing of a module carrier for the plug-in card.

15. A method for testing a battery control unit using a battery emulation device having a control unit and at least one emulation channel for emulating a battery cell voltage at a terminal of the control unit, the method comprising:

providing a connections from the at least one emulation channel to a reference potential, to a terminal of the battery control unit, and to at least one other emulation channel;

recording the reference potential at another terminal of the control unit and recording an output voltage of the emulation channel at the terminal of the battery control unit;

transferring measured voltages to an amplifier unit; and simulating a fault state by controlling at least one switch provided in the at least one emulation channel.

16. The method according to claim 15, wherein the fault state is a cable rupture.

* * * * *